(12) United States Patent
Jiang et al.

(10) Patent No.: US 11,770,121 B2
(45) Date of Patent: Sep. 26, 2023

(54) POWER SWITCH DEVICE DRIVER WITH ENERGY RECOVERING AND THE METHOD THEREOF

(71) Applicant: Monolithic Power Systems, Inc., San Jose, CA (US)

(72) Inventors: Jian Jiang, Saratoga, CA (US); Di Han, San Jose, CA (US); NaiXing Kuang, Hangzhou (CN); Zhijun Ye, Hangzhou (CN)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 17/229,463

(22) Filed: Apr. 13, 2021

(65) Prior Publication Data

US 2022/0329240 A1 Oct. 13, 2022

(51) Int. Cl.
*H03K 17/0812* (2006.01)
*H03K 17/0412* (2006.01)

(52) U.S. Cl.
CPC ..... *H03K 17/0812* (2013.01); *H03K 17/0412* (2013.01); *H03K 2217/0036* (2013.01)

(58) Field of Classification Search
CPC ...... H03B 1/00; H03K 17/00; H03K 17/0412; H03K 17/0812; H03K 2217/00; H03K 2217/0036
USPC ......................................................... 327/108
See application file for complete search history.

(56) References Cited

U.S. PATENT DOCUMENTS

| 9,035,640 | B2 | 5/2015 | Deng |
| 9,602,004 | B2 | 3/2017 | Deng |
| 9,876,431 | B2 | 1/2018 | Li |
| 9,882,489 | B2 | 1/2018 | Li |
| 9,966,851 | B2 | 5/2018 | Ouyang |
| 10,075,075 | B2 | 9/2018 | Zhang |
| 10,181,793 | B2 | 1/2019 | Zhang |
| 10,250,141 | B2 | 4/2019 | Zhang |
| 10,651,738 | B2 | 5/2020 | Gong et al. |
| 10,951,049 | B2 | 3/2021 | Luo et al. |
| 2014/0246908 | A1* | 9/2014 | Chew ....................... H04Q 9/00 307/31 |
| 2018/0212437 | A1* | 7/2018 | Ouyang .............. H02J 7/00036 |

OTHER PUBLICATIONS

U.S. Appl. No. 16/988,380, filed Aug. 7, 2020, Chengdu Monolithic Power Systems.
U.S. Appl. No. 16/380,962, filed Apr. 10, 2019, Chengdu Monolithic Power Systems.
U.S. Appl. No. 16/440,936, filed Jun. 13, 2019, Chengdu Monolithic Power Systems.
U.S. Appl. No. 16/375,821, filed Apr. 4, 2019, Chengdu Monolithic Power Systems.

* cited by examiner

*Primary Examiner* — Cassandra F Cox
(74) *Attorney, Agent, or Firm* — Perkins Coie LLP

(57) ABSTRACT

A power switch device driver with energy recovery is discussed. The power switch device adopts four switches and one inductor with appropriate control to insure the switching speed and save the power loss.

15 Claims, 3 Drawing Sheets

POWER SWITCH DEVICE DRIVER WITH ENERGY RECOVERING AND THE METHOD THEREOF

FIELD

The present invention relates to electronic circuits, more specifically, the present invention relates to power switch device driver with energy recovering.

BACKGROUND

Controllable power switch devices, such as MOSFETs, IGBTs need a driver to control the turn-on and/or turn-off. Prior art typically adopts a one-leg driver 50 (also called as a totem-pole driver) to drive the power switch device S1, as shown in FIG. 1. The one-leg driver 50 charges and/or discharges a gate capacitance of the power switch device S1 by fixed voltage sources VDD and GND, so the energy loss is happened twice in the gate capacitance each switching cycle, which reduces efficiency.

SUMMARY

It is an object of the present invention to provide an improved power switch device driver, which solves the above problems.

In accomplishing the above and other objects, there has been provided, in accordance with an embodiment of the present invention, a power switch device driver, configured to drive a controllable power switch device having a first terminal, a second terminal, a control terminal, and an effective capacitor formed between the first terminal and the control terminal, the power switch device driver comprising: a first switch, coupled between a power supply and a first end of an inductor; a second switch, coupled between a voltage reference and the first end of the inductor; a third switch, coupled between the power supply and a second end of the inductor; a fourth switch, coupled between the voltage reference and the second end of the inductor; and a logical controller, configured to control the first switch, the second switch, the third switch, and the fourth switch in response to a logical control signal, an inductor current, and a voltage across the effective capacitor; wherein when the logical control signal goes high, the logical controller is configured to control the first switch to be ON, and control the second switch, the third switch, and the fourth switch to be OFF to charge the effective capacitor.

In addition, there has been provided, in accordance with an embodiment of the present invention, a driving method used to drive a power switch device, the power switch device has a first terminal, a second terminal, a control terminal, and an effective capacitor formed between the control terminal and the first terminal, the method comprising: using a first switch, a second switch, a third switch, a fourth switch and an inductor to drive the power switch device, the first switch coupled between a first end of the inductor and a power supply, the second switch coupled between the first end of the inductor and a voltage reference, the third switch coupled between a second end of the inductor and the power supply, and the fourth switch coupled between the second end of the inductor and the voltage reference; controlling the first switch, the second switch, the third switch and the fourth switch in response to a logical control signal, an inductor current, and a voltage across the effective capacitor; and turning on the first switch, and turning off the second switch, the third switch and the fourth switch, to charge the effective capacitor when the logical control signal goes high.

Furthermore, there has been provided, in accordance with an embodiment of the present invention, a power switch device driver, configured to drive a controllable power switch device having a first terminal, a second terminal, a control terminal, and an effective capacitor formed between the first terminal and the control terminal, the power switch device driver comprising: a first switch, coupled between a power supply and a first end of an inductor; a second switch, coupled between a voltage reference and the first end of the inductor; a third switch, coupled between the power supply and a second end of the inductor; a fourth switch, coupled between the voltage reference and the second end of the inductor; and a logical controller, having: a first current comparator, configured to compare a sense signal indicative of an inductor current with a first current threshold; a first voltage comparator, configured to compare a voltage across the effective capacitor with a first voltage limit; a second current comparator, configured to compare the sense signal with a second current threshold; a second voltage comparator, configured to compare the voltage across the effective capacitor with a second voltage limit; and a logical unit, configured to generate a first control signal, a second control signal, a third control signal, and a fourth control signal in response to a logical control signal and comparison results of the first current comparator, the first voltage comparator, the second current compactor, and the second voltage comparator, to control the first switch, the second switch, the third switch, and the fourth switch, respectively.

The use of the similar reference label in different drawings indicates the same of like components.

DETAILED DESCRIPTION

Embodiments of circuits for power switch device driver are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 1:
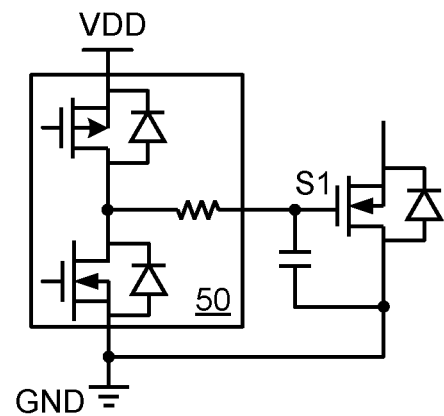
FIG. 1 schematically shows a prior one-leg driver 50 of a controller power switch device.
Figure 2:
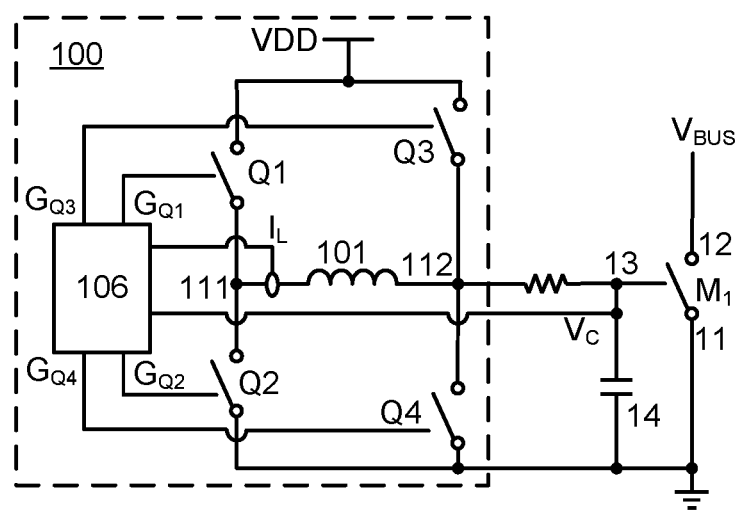
FIG. 2 schematically shows a power switch device driver 100 in accordance with an embodiment of the present invention.

FIG. 2 schematically shows a power switch device driver 100 in accordance with an embodiment of the present invention. In the example of FIG. 2, the power switch device driver 100 is configured to drive a controllable power switch device $M_1$ having a first terminal 11, a second terminal 12, a control terminal 13, and an effective capacitor 14 formed between the first terminal 11 and the control terminal 13. The power switch device driver 100 comprises: a first switch Q1, coupled between a power supply VDD and a first end 111 of an inductor 101; a second switch Q2, coupled between a voltage reference (e.g. ground or a negative rail) and the first end 111 of the inductor 101; a third switch Q3, coupled between the power supply VDD and a second end 112 of the inductor 101; and a fourth switch Q4, coupled between the voltage reference and the second end 112 of the inductor 101.

In the example of FIG. 2, the power switch device driver further comprise: a logical controller 106, configured to control the first switch Q1, the second switch Q2, the third switch Q3, and the fourth switch Q4 in response to a logical control signal PWM, an inductor current(e.g., a sense signal $I_L$ indicative of the inductor current), and a voltage $V_C$ across the effective capacitor 14.

In one embodiment of the present invention, when the logical control signal PWM goes high, the logical controller 106 is configured to control the first switch Q1 to be ON, and control the second switch Q2, the third switch Q3, and the fourth switch Q4 to be OFF to charge the effective capacitor 14.

In one embodiment of the present invention, the controllable power switch device may comprise a MOSFET or an IGBT. In other embodiments of the present invention, the controllable power switch device may comprise other switch devices, such as BJTs.

In one embodiment of the present invention, the logical controller 106 is further configured to control the first switch Q1 and the third switch Q3 to be ON, and control the second switch Q2 and the fourth switch Q4 to be OFF when a first condition is met. Then the voltage $V_C$ across the effective capacitor 14 will be pulled to the power supply via the third switch Q3. In one embodiment of the present invention, the first condition is met when the inductor current reaches a first current limit; or when the voltage $V_C$ across the effective capacitor 14 reaches a first voltage limit. In another embodiment of the present invention, the first condition may be met when a preset timer expires.

In one embodiment of the present invention, the logical controller 106 is further configured to control the second switch Q2 and the third switch Q3 to be ON, and control the first switch Q1 and the fourth switch Q4 to be OFF when the voltage $V_C$ across the effective capacitor 14 is close to the power supply VDD (e.g., when the voltage $V_C$ reaches the power supply VDD).

In one embodiment of the present invention, the logical controller 106 is further configured to control the first switch Q1 and the third switch Q3 to be ON, and control the second switch Q2 and the fourth switch Q4 to be OFF when the inductor current falls to zero.

In one embodiment of the present invention, the logical controller 106 is further configured to control the second switch Q2 to be ON, and control the first switch Q1, the third switch Q3, and the fourth switch Q4 to be OFF when the logical control signal PWM goes low, to discharge the effective capacitor 14.

In one embodiment of the present invention, the logical controller 106 is further configured to control the second switch Q2 and the fourth switch Q4 to be ON, and control the first switch Q1 and the third switch Q3 to be OFF when a second condition is met. Then the voltage $V_C$ across the effective capacitor 14 will be pulled to the voltage reference by way of the fourth switch Q4. In one embodiment of the present invention, the second condition is met when the inductor current reaches a second current limit; or when the voltage $V_C$ across the effective capacitor 14 falls to a second voltage limit. In another embodiment of the present invention, the second condition may be met when the preset timer expires.

In one embodiment of the present invention, the logical controller 106 is further configured to control the first switch Q1 and the fourth switch Q4 to be ON, and control the second switch Q2 and the third switch Q3 to be OFF when the voltage $V_C$ across the effective capacitor 14 is close to the voltage reference (e.g., the voltage $V_C$ falls to the voltage reference).

In one embodiment of the present invention, the logical controller 106 is further configured to control the first switch Q1 and the third switch Q3 to be OFF, and control the second switch Q2 and the fourth switch Q4 to be ON when the inductor current falls to zero.

In one embodiment of the present invention, the first voltage limit is below a Miller plateau threshold of the MOSFET; and the second voltage limit is above the Miller plateau threshold of the MOSFET. The so called Miller plateau threshold is caused by the non-ideal characteristic of the semiconductor switches. In the control terminal (e.g. the gate) charge characteristics of the semiconductor switch, there is a horizontal portion called Miller plateau. When the switch device is going to turned on and/or turned off, the voltage at the control terminal is actually clamped to the plateau voltage and stays there until sufficient charge has been added and/or removed.

Figure 3:
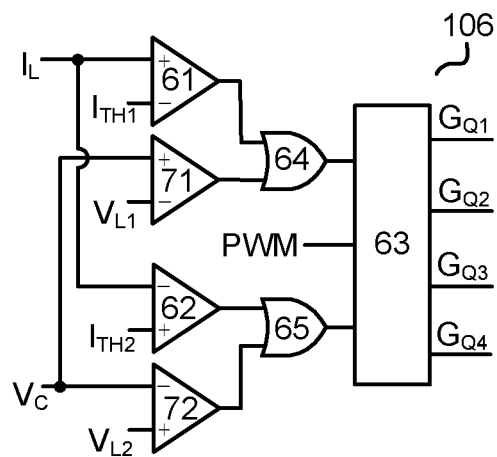
FIG. 3 schematically shows a circuit configuration of the logical controller 106 in accordance with an embodiment of the present invention.

FIG. 3 schematically shows a circuit configuration of the logical controller 106 in accordance with an embodiment of the present invention. In the example of FIG. 3, the logical controller 106 comprises: a first current comparator 61, configured to compare the sense signal $I_L$ with a first current threshold $I_{TH1}$; a first voltage comparator 71, configured to compare the voltage $V_C$ across the effective capacitor 14 with the first voltage limit $V_{L1}$; a second current comparator 62, configured to compare the sense signal $I_L$ with a second current threshold $I_{TH2}$; and a second voltage comparator 72, configured to compare the voltage $V_C$ across the effective capacitor 14 with the second voltage limit $V_{L2}$.

In the example of FIG. 3, the logical controller 106 further comprises: a logical unit 63, configured to generate a first control signal $G_{Q1}$, a second control signal $G_{Q2}$, a third control signal $G_{Q3}$, and a fourth control signal $G_{Q4}$ in response to a logical control signal and comparison results of the first current comparator, the first voltage comparator, the second current compactor, and the fourth comparator, to control the first switch Q1, the second switch Q2, the third switch Q3, and the fourth switch Q4, respectively.

That is, the logical unit 63 is configured to control the first switch Q1, the second switch Q2, the third switch Q3, and the fourth switch Q4 in response to the logical control signal PWM and a) a comparison result of the sense signal $I_L$ and the first current threshold $I_{TH1}$, b) a comparison result of the voltage $V_C$ across the effective capacitor 14 and the first voltage limit $V_{L1}$, c) a comparison result of the sense signal $I_L$ and the second current threshold $I_{TH2}$, d) a comparison result of the voltage $V_C$ across the effective capacitor 14 with the second voltage limit $V_{L2}$.

In one embodiment of the present invention, the logical controller 106 further comprises: a first logical OR unit 64, configured to perform a logical OR operation on a) the comparison result of the sense signal $I_L$ and the first current threshold $I_{TH1}$, and b) the comparison result of the voltage $V_C$ across the effective capacitor 14 and the first voltage limit $V_{L1}$.

In one embodiment of the present invention, the logical controller 106 further comprises: a second logical OR unit 65, configured to perform a logical OR operation on c) the comparison result of the sense signal $I_L$ and the second current threshold $I_{TH2}$, and d) the comparison result of the voltage $V_C$ across the effective capacitor 14 and the second voltage limit $V_{L2}$.

Figure 4:
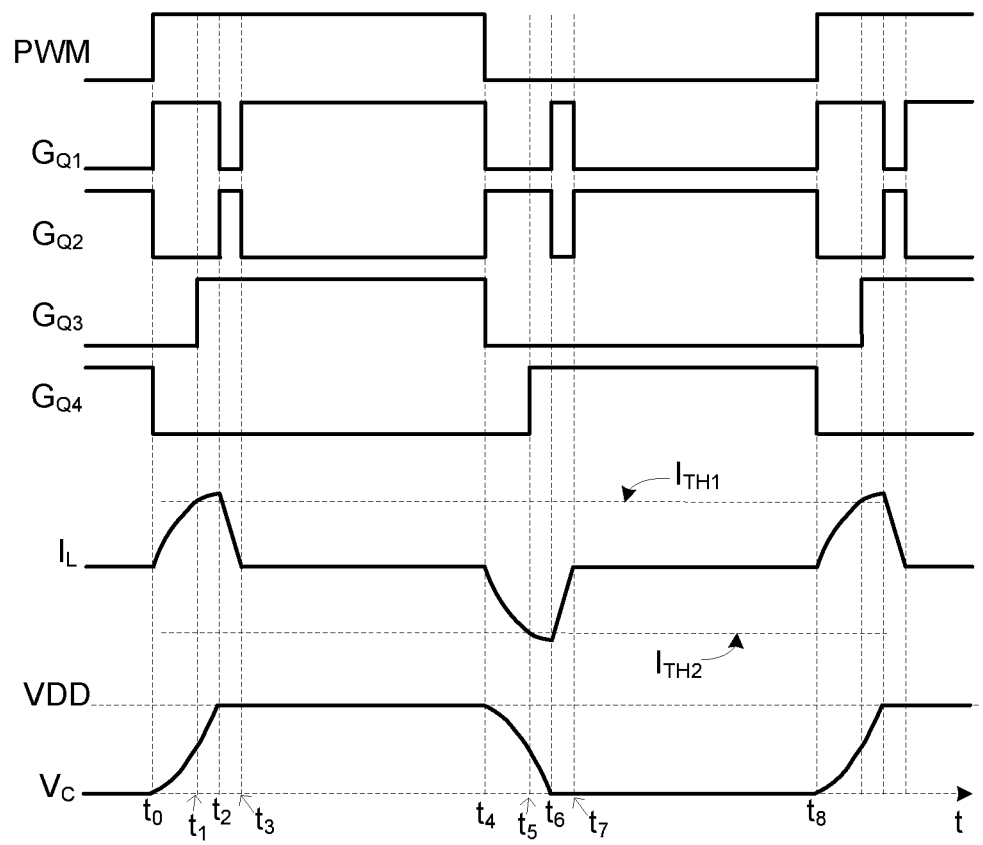
FIG. 4 schematically shows the waveforms of the logical control signal PWM, the first to fourth control signals $G_{Q1}$~$G_{Q4}$, the sense signal $I_L$, and the voltage $V_C$ across the effective capacitor 14.

FIG. 4 schematically shows the waveforms of the logical control signal PWM, the first to fourth control signals $G_{Q1}$~$G_{Q4}$, the sense signal $I_L$, and the voltage $V_C$ across the effective capacitor 14.

Time interval $t_0$-$t_1$: at time point $t_0$, the logical control signal PWM goes high from low. Accordingly, the first control signal $G_{Q1}$ goes high to turn on the first switch Q1, the fourth control signal $G_{Q4}$ goes low to turn off the fourth switch Q4, the second control signal $G_{Q2}$ and the third control signal $G_{Q3}$ keep low to respectively maintain the OFF status of the second switch Q2 and the third switch Q3. So the power supply VDD, the first switch Q1, the inductor 101, and the effective capacitor 14 form a current loop. The inductor current (i.e. the sense signal $I_L$) starts to rise from zero and the effective capacitor 14 is charged to have the voltage $V_C$ be increased.

Time interval $t_1$-$t_2$: at time point $t_1$, the sense signal $I_L$ rises to the first current threshold $I_{TH1}$, indicating the inductor current reaches the first current limit. The third control signal $G_{Q3}$ goes high to turn on the third switch Q3, the first control signal $G_{Q1}$ keeps high to maintain the first switch Q1's ON status, the second control signal $G_{Q2}$ and the fourth control signal $G_{Q4}$ keep low to respectively maintain the OFF status of the second switch Q2 and the fourth switch Q4. Then the power supply VDD, the first switch Q1, the inductor 101, the third switch Q3, and the effective capacitor 14 form a current loop. The inductor current (i.e. the sense signal $I_L$) continues to increase; and the voltage $V_C$ across the effective capacitor 14 is pulled to the power supply soon.

In one embodiment of the present invention, if the voltage $V_C$ reaches the first voltage limit $V_{L1}$ earlier than the inductor current's reaching the first current limit, the third control signal $G_{Q3}$ immediately goes high to turn on the third switch Q3, the first control signal $G_{Q1}$ keeps high, and the second control signal $G_{Q2}$ and the fourth control signal $G_{Q4}$ keep low.

Time interval $t_2$-$t_3$: at time point $t_2$, the voltage $V_C$ is close to the voltage of the power supply VDD (i.e., the voltage $V_C$ reaches the voltage of the power supply VDD minus a drain-source voltage of the third switch Q3), which is enough high to turn on the power switch device $M_1$. The third control signal $G_{Q3}$ keeps high to maintain the ON status of the third switch Q3, the first control signal $G_{Q1}$ goes low to turn off the first switch Q1, the second control signal $G_{Q2}$ goes high to turn on the second switch Q2 with zero voltage switching since the inductor current is forced to flow through the body diode of Q2, and the fourth control signal $G_{Q4}$ keeps low to maintain the fourth switch Q4's OFF status. Then the rest energy in the inductor 101 (i.e. the non-zero inductor current) is returned to the power supply VDD.

Time interval $t_3$-$t_4$: at time point $t_3$, the inductor current falls to zero. The second control signal $G_{Q2}$ goes low to turn off the second switch with zero current switching. The first control signal $G_{Q1}$ goes high to turn on the first switch Q1, and the third control signal $G_{Q3}$ keeps high to maintain the third switch Q3's ON status, to insure the voltage $V_C$ be close to the power supply VDD to provide sufficient drive capability. The fourth control signal $G_{Q4}$ keeps low to maintain the fourth switch Q4's OFF status.

Time interval $t_4$-$t_5$: at time point $t_4$, the logical control signal PWM goes low from high. Accordingly, the second control signal $G_{Q2}$ goes high to turn on the second switch Q2, the first control signal $G_{Q1}$ goes low to turn off the first switch Q1, the third control signal $G_{Q3}$ and the fourth control signal $G_{Q4}$ keep low to respectively maintain the OFF status of the third switch Q3 and the fourth switch Q4. So the effective capacitor 14, the inductor 101, and the second switch Q2 form a current loop. The inductor current (i.e. the sense signal $I_L$) starts to rise inversely from zero, and the effective capacitor 14 is discharged to have the voltage $V_C$ be decreased.

Time interval $t_5$-$t_6$: at time point $t_5$, the sense signal $I_L$ inversely rises to the second current threshold $I_{TH2}$, indicating the inductor current reaches the second current limit. The fourth control signal $G_{Q4}$ goes high to turn on the fourth switch Q4; the second control signal $G_{Q2}$ keeps high to maintain the second switch Q2's ON status, the first control signal $G_{Q1}$ and the third control signal $G_{Q3}$ keep low to respectively maintain the OFF status of the first switch Q1 and the third switch Q3. Then the effective capacitor 14, the fourth switch Q4, the inductor 101, and the second switch Q2 form a current. The inductor current (i.e. the sense signal $I_L$) continues to increase inversely; and the voltage $V_C$ across the effective capacitor 14 is pulled to the voltage reference (e.g. ground) soon.

In one embodiment of the present invention, if the voltage $V_C$ falls to the second voltage limit $V_{L2}$ earlier than the inductor current's reaching the second current limit, the fourth control signal $G_{Q4}$ immediately goes high to turn on the fourth switch Q4, the second control signal $G_{Q2}$ keeps high, and the first control signal $G_{Q1}$ and the third control signal $G_{Q3}$ keep low.

Time interval $t_6$-$t_7$: at time point $t_6$, the voltage $V_C$ is close to the voltage reference, which is enough low to turn off the power switch device $M_1$. The fourth control signal $G_{Q4}$ keeps high to maintain the fourth switch Q4's ON status. The second control signal $G_{Q2}$ goes low to turn off the second switch Q2, the first control signal $G_{Q1}$ goes high to turn on the first switch Q1 with zero voltage switching since the inductor current is forced to flow through the body diode of Q1, and the third control signal $G_{Q3}$ keeps low to maintain the third switch Q3's OFF status. Then the rest energy in the inductor 101 (i.e. the non-zero inductor current) is returned to the power supply VDD.

Time interval $t_7$-$t_8$: at time point $t_7$, the inductor current falls to zero. The first control signal $G_{Q1}$ goes low to turn off the first switch $Q_1$ with zero current switching. The second control signal $G_{Q2}$ goes high to turn on the second switch Q2, and the fourth control signal $G_{Q4}$ keeps high to maintain the fourth switch Q4's ON status, to insure the voltage $V_C$ be close to the voltage reference to fully turn off the power switch device $M_1$. The third control signal $G_{Q3}$ keeps low to maintain the third switch Q3's OFF status.

Then at time point $t_8$, the logical control signal PWM goes high from low again. A new switching cycle is started and operates as discussed above.

Figure 5:
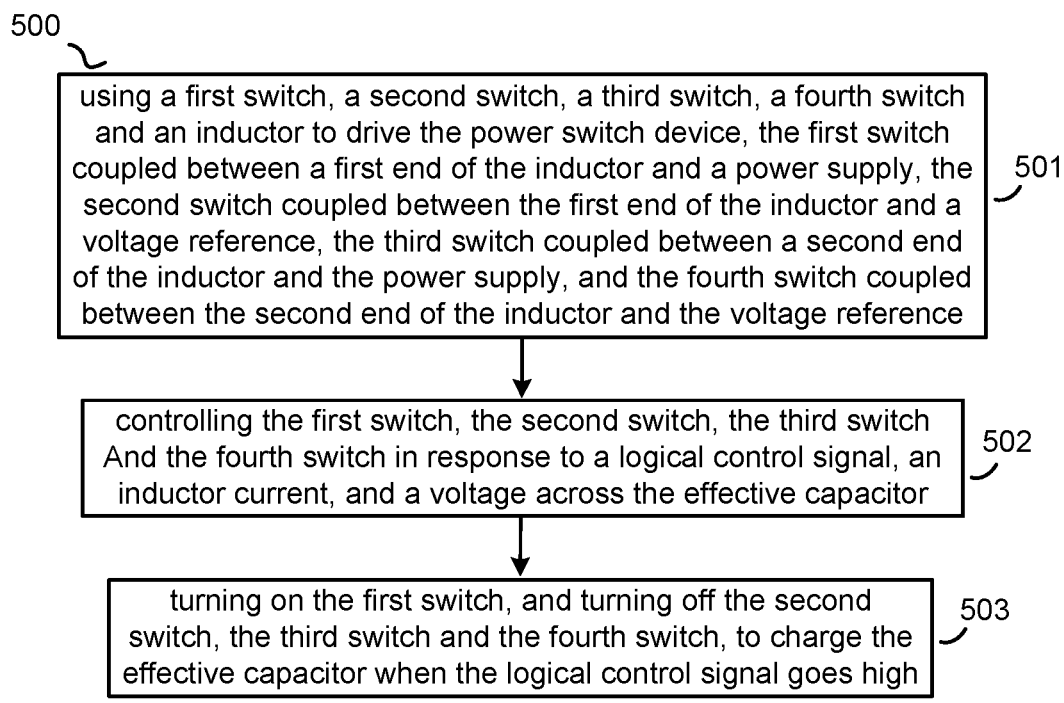
FIG. 5 schematically shows a flowchart 500 of a driving method used to drive a power switch device in accordance with an embodiment of the present invention.

FIG. 5 schematically shows a flowchart 500 of a driving method used to drive a power switch device in accordance with an embodiment of the present invention. The power switch device has a first terminal, a second terminal, a control terminal, and an effective capacitor; the effective capacitor being formed between the control terminal and the first terminal. The method comprises:

Step 501, using a first switch, a second switch, a third switch, a fourth switch and an inductor to drive the power switch device, the first switch coupled between a first end of the inductor and a power supply, the second switch coupled between the first end of the inductor and a voltage reference, the third switch coupled between a second end of the inductor and the power supply, and the fourth switch coupled between the second end of the inductor and the voltage reference.

Step 502, controlling the first switch, the second switch, the third switch and the fourth switch in response to a logical control signal, an inductor current, and a voltage across the effective capacitor. And Step 503, turning on the first switch, and turning off the second switch, the third switch and the fourth switch, to charge the effective capacitor when the logical control signal goes high.

In one embodiment of the present invention, the method further comprises: turning on the third switch, maintaining the first switch's ON status, and maintaining an OFF status of the second switch and the fourth switch when a first condition is met, to pull a voltage across the effective capacitor to be close to the power supply. In one embodiment, the first condition comprises: the inductor current reaches a first current limit; or the voltage across the effective capacitor reaches a voltage limit.

In one embodiment of the present invention, the method further comprises: turning off the first switch, turning on the second switch, and maintaining the third switch's ON status and the fourth switch's OFF status when the voltage across the effective capacitor is close to the power supply, to return the rest energy in the inductor to the power supply.

In one embodiment of the present invention, the method further comprises: turning on the first switch, turning off the second switch, and maintaining the third switch's ON status and the fourth switch's OFF status when the inductor current falls to zero.

In one embodiment of the present invention, the method further comprises: turning on the second switch, and turning off the first switch, the third switch and the fourth switch when the logical control signal goes low, to discharge the effective capacitor.

In one embodiment of the present invention, the method further comprises: turning on the fourth switch, and maintaining the second switch's ON status, and the OFF status of the first switch and the third switch when a second condition is met. In one embodiment of the present invention, the second condition comprises: the inductor current reaches a second current limit; or the voltage across the effective capacitor falls to a second voltage limit.

In one embodiment of the present invention, the method further comprises: turning on the first switch, turning off the second switch, and maintain the third switch's OFF status and the fourth switch's ON status when the voltage across the effective capacitor falls to be closes to the voltage reference.

In one embodiment of the present invention, the method further comprises: turning off the first switch, turning on the second switch, and maintaining the third switch's OFF status and the fourth switch's ON status when the inductor current falls to zero.

Several embodiments of the foregoing power switch device driver realize energy recovery without sacrificing the switching speed. Unlike the conventional technique, several embodiments of the foregoing power switch device driver comprise a resonant inductor and four switches with appropriate control, to charge the effective capacitor once the logical control signal goes high, and to discharge the effective capacitor once the logical control signal goes low with no delay, so as to insure the switching speed; and to return part of the energy to the power supply when the effective capacitor is charged to a desired voltage level and/or is discharged to a desired voltage level, thus power loss is reduced, and half power rated supply can be used compared to the conventional driver.

It is to be understood in these letters patent that the meaning of "A" is coupled to "B" is that either A and B are connected to each other as described below, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

This written description uses examples to disclose the invention, including the best mode, and also to enable a person skilled in the art to make and use the invention. The patentable scope of the invention may include other examples that occur to those skilled in the art.

What is claimed is:

1. A power switch device driver, configured to drive a controllable power switch device to operate between ON and OFF, the controllable power switch device having a first terminal, a second terminal, a control terminal, and an effective capacitor formed between the first terminal and the control terminal, the power switch device driver comprising:
a first switch, coupled between a power supply and a first end of an inductor;
a second switch, coupled between a voltage reference and the first end of the inductor;
a third switch, coupled between the power supply and a second end of the inductor;
a fourth switch, coupled between the voltage reference and the second end of the inductor; and
a logical controller, configured to control the first switch, the second switch, the third switch, and the fourth switch in response to a logical control signal, an inductor current, and a voltage across the effective capacitor; wherein when the logical control signal goes high, the logical controller is configured to control the first switch to be ON, and control the second switch, the third switch, and the fourth switch to be OFF to charge the effective capacitor; and wherein
the logical controller is further configured to control the second switch to be ON, and control the first switch, the third switch, and the fourth switch to be OFF when the logical control signal goes low, to discharge the effective capacitor.

2. The power switch device driver of claim 1, wherein:
the logical controller is further configured to control the first switch and the third switch to be ON; and control the second switch and the fourth switch to be OFF when a first condition is met.

3. The power switch device driver of claim 2, wherein the first condition is met when the inductor current reaches a first current limit, or when the voltage across the effective capacitor reaches a first voltage limit.

4. The power switch device driver of claim 1, wherein:
the logical controller is further configured to control the second switch and the third switch to be ON, and control the first switch and the fourth switch to be OFF when the voltage across the effective capacitor reaches the power supply.

5. The power switch device driver of claim 1, wherein: the logical controller is further configured to control the first switch and the third switch to be ON, and control the second switch and the fourth switch to be OFF when the inductor current falls to zero.

6. The power switch device driver of claim 1, wherein: the logical controller is further configured to control the second switch and the fourth switch to be ON, and control the first switch and the third switch to be OFF when a second condition is met.

7. The power switch device driver of claim 6, wherein the second condition is met when the inductor current reaches a second current limit, or when the voltage across the effective capacitor falls to a second voltage limit.

8. The power switch device driver of claim 1, wherein: the logical controller is further configured to control the first switch and the fourth switch to be ON, and control the second switch and the third switch to be OFF when the voltage across the effective capacitor reaches the voltage reference.

9. The power switch device driver of claim 1, wherein: the logical controller is further configured to control the first switch and the third switch to be OFF, and control the second switch and the fourth switch to be ON when the inductor current falls to zero.

10. A driving method used to drive a power switch device to operate between ON and OFF, the power switch device has a first terminal, a second terminal, a control terminal, and an effective capacitor formed between the control terminal and the first terminal, the method comprising:
using a first switch, a second switch, a third switch, a fourth switch and an inductor to drive the power switch device, the first switch coupled between a first end of the inductor and a power supply, the second switch coupled between the first end of the inductor and a voltage reference, the third switch coupled between a second end of the inductor and the power supply, and the fourth switch coupled between the second end of the inductor and the voltage reference;
controlling the first switch, the second switch, the third switch and the fourth switch in response to a logical control signal, an inductor current, and a voltage across the effective capacitor;
turning on the first switch, and turning off the second switch, the third switch and the fourth switch, to charge the effective capacitor when the logical control signal goes high; and
turning on the second switch, and turning off the first switch, the third switch and the fourth switch when the logical control signal goes low, to discharge the effective capacitor.

11. The driving method of claim 10, further comprising:
turning on the third switch, maintaining the first switch's ON status, and maintaining an OFF status of the second switch and the fourth switch when the inductor current reaches a first current limit or when the voltage across the effective capacitor reaches a voltage limit, to pull a voltage across the effective capacitor to the power supply;
turning off the first switch, turning on the second switch, and maintaining the third switch's ON status and the fourth switch's OFF status when the voltage across the effective capacitor reaches the power supply; and
turning on the first switch, turning off the second switch, and maintaining the third switch's ON status and the fourth switch's OFF status when the inductor current falls to zero.

12. The driving method of claim 10, further comprising:
turning on the fourth switch, and maintaining the second switch's ON status, and an OFF status of the first switch and the third switch when the inductor current reaches a second current limit or when the voltage across the effective capacitor falls to a second voltage limit;
turning on the first switch, turning off the second switch, and maintain the third switch's OFF status and the fourth switch's ON status when the voltage across the effective capacitor falls to be closes to the voltage reference; and
turning off the first switch, turning on the second switch, and maintaining the third switch's OFF status and the fourth switch's ON status when the inductor current falls to zero.

13. A power switch device driver, configured to drive a controllable power switch device to operate between ON and OFF, the controllable power switch device having a first terminal, a second terminal, a control terminal, and an effective capacitor formed between the first terminal and the control terminal, the power switch device driver comprising:
a first switch, coupled between a power supply and a first end of an inductor;
a second switch, coupled between a voltage reference and the first end of the inductor;
a third switch, coupled between the power supply and a second end of the inductor;
a fourth switch, coupled between the voltage reference and the second end of the inductor; and
a logical controller, having:
a first current comparator, configured to compare a sense signal indicative of an inductor current with a first current threshold;
a first voltage comparator, configured to compare a voltage across the effective capacitor with a first voltage limit;
a second current comparator, configured to compare the sense signal with a second current threshold, the first current threshold having a positive value and the second current threshold having a negative value;
a second voltage comparator, configured to compare the voltage across the effective capacitor with a second voltage limit; and
a logical unit, configured to generate a first control signal, a second control signal, a third control signal, and a fourth control signal in response to a logical control signal and comparison results of the first current comparator, the first voltage comparator, the second current comparator, and the second voltage comparator, to control the first switch, the second switch, the third switch, and the fourth switch, respectively; wherein the logical controller is configured to:
control the first switch to be ON, and control the second switch, the third switch, and the fourth switch to be OFF when the logical control signal goes high, to charge the effective capacitor; and
control the second switch to be ON, and control the first switch, the third switch, and the fourth switch to be OFF when the logical control signal goes low, to discharge the effective capacitor.

14. The power switch device driver of claim 13, wherein the logical controller is further configured to:
- control the first switch and the third switch to be ON, and control the second switch and the fourth switch to be OFF when the sense signal reaches the first current threshold or when the voltage across the effective capacitor reaches the first voltage limit;
- control the second switch and the third switch to be ON, and control the first switch and the fourth switch to be OFF when the voltage across the effective capacitor reaches the power supply; and
- control the first switch and the third switch to be ON, and control the second switch and the fourth switch to be OFF when the inductor current falls to zero.

15. The power switch device driver of claim 13, wherein the logical controller is further configured to:
- to control the second switch and the fourth switch to be ON, and control the first switch and the third switch to be OFF when the sense signal reaches the second current threshold or when the voltage across the effective capacitor falls to the second voltage limit;
- the logical controller is further configured to control the first switch and the fourth switch to be ON, and control the second switch and the third switch to be OFF when the voltage across the effective capacitor reaches the voltage reference; and
- the logical controller is further configured to control the first switch and the third switch to be OFF, and control the second switch and the fourth switch to be ON when the inductor current falls to zero.

* * * * *